(12) United States Patent
Green

(10) Patent No.: US 7,602,015 B2
(45) Date of Patent: Oct. 13, 2009

(54) PROCESS TO CONTROL SEMICONDUCTOR WAFER YIELD

(75) Inventor: Simon Green, Cardiff (GB)

(73) Assignee: International Rectifier Corporation, El Segundo, CA (US)

( * ) Notice: Subject to any disclaimer, the term of this patent is extended or adjusted under 35 U.S.C. 154(b) by 331 days.

(21) Appl. No.: 11/464,619

(22) Filed: Aug. 15, 2006

(65) Prior Publication Data
US 2007/0187754 A1 Aug. 16, 2007

Related U.S. Application Data

(60) Provisional application No. 60/711,108, filed on Aug. 25, 2005.

(51) Int. Cl.
*H01L 27/108* (2006.01)
*H01L 29/76* (2006.01)
(52) U.S. Cl. ............... 257/331; 257/330; 257/E29.109; 257/E21.359; 438/270
(58) Field of Classification Search ......... 257/330–331, 257/E21.009, E21.461, E21.466, E29.005, 257/E21.359, E29.109, 487, 496
See application file for complete search history.

(56) References Cited

U.S. PATENT DOCUMENTS

| | | | | |
|---|---|---|---|---|
| 6,129,047 A | * | 10/2000 | Nakamura | 118/725 |
| 6,639,301 B2 | * | 10/2003 | Andoh | 257/606 |
| 2002/0121663 A1 | * | 9/2002 | Azam et al. | 257/330 |
| 2003/0034511 A1 | * | 2/2003 | Hurley et al. | 257/296 |
| 2004/0077149 A1 | * | 4/2004 | Renau | 438/308 |
| 2004/0262677 A1 | * | 12/2004 | Harada | 257/329 |
| 2005/0001240 A1 | * | 1/2005 | Choi et al. | 257/202 |
| 2005/0124085 A1 | * | 6/2005 | Andoh et al. | 438/17 |

* cited by examiner

*Primary Examiner*—Wael Fahmy
*Assistant Examiner*—Sarah K Salerno
(74) *Attorney, Agent, or Firm*—Farjami & Farjami LLP

(57) ABSTRACT

The size of $BV_{DSS}$ distribution is controlled by the active manipulation of the distribution of silicon parameters across a wafer to offset opposing effects inherent in the wafer fabrication process. Thus, the resistivity of the silicon wafer is increased toward the edge of the wafer. This offsets the drop-off of $BV_{DSS}$ across the wafer caused in wafer fabrication by deeper trenches at the edge of the wafer. This causes a flatter $BV_{DSS}$ profile across the wafer and significantly reduced BV distribution over the wafer.

12 Claims, 1 Drawing Sheet

Reduced EPI Concentration

PROCESS TO CONTROL SEMICONDUCTOR WAFER YIELD

RELATED APPLICATION

This application is based on and claims the benefit of U.S. Provisional Application Ser. No. 60/711,108, filed on Aug. 25, 2006, entitled Semiconductor Switch Half-Bridge Module with Low Inductance, to which a claim of priority is hereby made and the disclosure of which is incorporated by reference.

FIELD OF THE INVENTION

This invention relates to semiconductor device fabrication, and more specifically relates to improvement of yield of die with closely similar characteristics from a semiconductor wafer.

BACKGROUND OF THE INVENTION

The simultaneous processing of a large number of semiconductor die in a parent wafer is well known. After all common processing steps have been carried out, the die are singulated, or separated from one another for packaging or other application.

It has been found that while every location on a wafer is expected to react to processing identically to other locations, in fact some areas react differently than others. Thus, in copending application Ser. No. 10/728,482, filed Dec. 4, 2003 in the names of Kohji Andoh and Davide Chiola (IR-2076) the contents of which are incorporated herein by reference, the resistivity at the surface of a wafer may vary, and is adjusted so that the final wafer presents a uniform resistivity over its entire surface.

It has been found, particularly for the production of trench type MOSFETs, or other trench devices, that the trenches at the outer peripheral areas of the wafer are deeper than those in the central areas of the wafer. This results in a reduced breakdown voltage ($BV_{DSS}$) of die which are (or were) located in the outer peripheral areas of the wafer.

It would be desirable to adjust the process so that the die taken from the outer peripheral areas of the wafer have characteristics such as $BV_{DSS}$ which more closely match those of die taken from the more central body areas of the wafer.

BRIEF DESCRIPTION OF THE INVENTION

In accordance with the invention, the resistivity of the silicon toward the edge of the wafer is increased, driving $BV_{DSS}$ higher in die taken from the wafer outer diameter regions. This offsets the drop in $BV_{DSS}$ across the wafer caused by deeper trenches at the edge of the wafer formed during the wafer fabrication process. The end result is a flatter $BV_{DSS}$ profile across the wafer and a significantly reduced $BV_{DSS}$ profile across the wafer and a significantly reduced $BV_{DSS}$ distribution in die singulated from the wafer.

Thus, the invention provides improved manufacturability, increased design margin and reduced loss of die from the wafer outer periphery due to reduced $BV_{DSS}$.

More specifically, the size of $BV_{DSS}$ distribution is controlled by the active manipulation of the distribution of silicon parameters across a wafer to offset opposing effects inherent in the wafer fabrication process. Thus, the resistivity of the silicon wafer is increased toward the edge of the wafer. This offsets the drop-off of $BV_{DSS}$ across the wafer caused in wafer fabrication by deeper trenches at the edge of the wafer created during a common trench etch over the whole surface area of the wafer. This causes a flatter $BV_{DSS}$ profile across the wafer and significantly reduced BV distribution over the wafer.

DETAILED DESCRIPTION OF THE INVENTION

Figure 1:
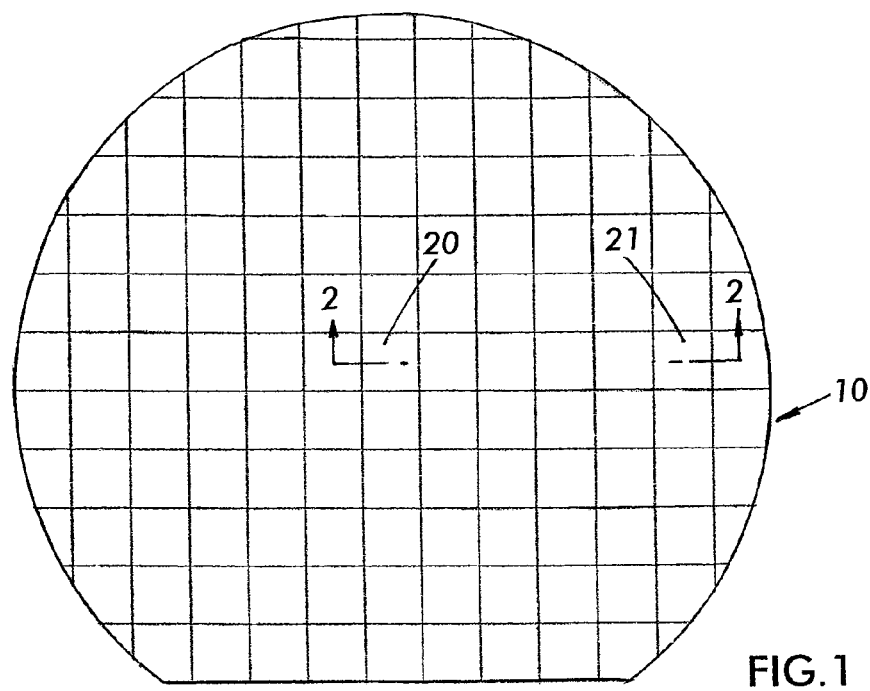
FIG. 1 is a plan view of a semiconductor wafer with plural die locations shown in a grid fashion.
Figure 2:
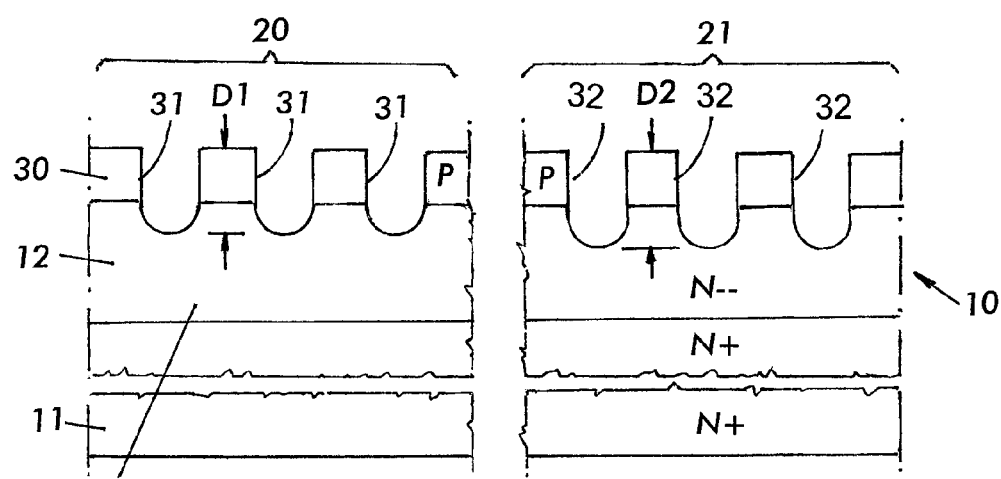
FIG. 2 is a cross-section of FIG. 1 taken across section line 2-2 in FIG. 1, after the formation of trenches, and demonstrating the deeper trenches at the outer diameter surface (volume) regions of the wafer and the reduced epitaxial silicon impurity concentration in that outer diameter area to compensate for the reduced $BV_{DSS}$ due to the deeper trenches.

Referring first to FIGS. 1 and 2, there is shown a wafer 10 having a monocrystalline silicon body or substrate 11 which may be of high concentration $N^+$ type material with flat parallel surfaces and any desired thickness, for example, 350 μm. A lower concentration $N^+$ epitaxially formed layer 12 is grown atop substrate 11 in the well known manner, with a thickness and N type impurity concentration selected to meet a desired rated breakdown voltage $BV_{DSS}$ as is well known. In the conventional wafer of this type, known as an epi wafer, the concentration and thickness of layer 12 is constant across its full diameter.

The full wafer 10 is processed in a conventional wafer fabrication facility and a plurality of identical die, of any desired shape and dimensions, shown as the plural squares in FIG. 1 are simultaneously processed. When processing is complete, the wafer is diced to separate the identical die from one another. Any desired number of die are formed, depending on their desired size and the wafer diameter.

It is desirable that all die have closely similar characteristics within the limits of a given specification. However, it has been found that when the die have a trench-type topology, as used to form trench type MOSFETs, trench type Schottky diodes, and the like, that the die coming from the outer diameter regions of wafer 10 have a lower break down voltage $BV_{DSS}$ than those from more central portions of the die. Thus, a central die 20 will have a $BV_{DSS}$, which is within the target $BV_{DSS}$ desired, but a peripheral die 21, which was subject to the same process steps as die 20, will have a $BV_{DSS}$ which is lower than that of die 20 and is less than the target value.

In forming such trench devices, a common process flow includes the blanket implant and diffusion of a P type base or channel layer 30 into the layer 12, followed by the formation by etching, of trenches, such as trenches 31 in die location 20 and trenches 32 in die location 21 (FIG. 2). It has been found that the trenches 31 in the outer peripheral portions (for example, the die in the outer ½ inch ring if an 8 inch diameter wafer) have a greater depth $D_2$ than the depth $D_1$ of the more central die locations. This occurs even though the full wafer area is subject to identical processing steps.

The result is that the breakdown voltage of the outer peripheral die is unexpectedly reduced.

In accordance with the invention, and to off-set this reduction in $BV_{DSS}$, the resistivity in the epitaxial layer in the outer peripheral ring is increased as compared to that in the more central portions of the wafer to increase the $BV_{DSS}$ of the die from the outermost peripheral area (for example, a ½ inch radial ring extending to the edge of the wafer) to the desired rated $BV_{DSS}$.

Note that this reduction in concentration (and increase in resistivity) can be constant over the diameter of the outer ring, or may taper down gradually over the radius of the ring toward the wafer edge.

The control of the reduction of the concentration in the ring can take place during the deposition of layer 12, or can be accomplished by diffusion of a compensating P type species.

Alternatively, an intentionally higher N type concentration can be initially formed for layer 12, and the concentration at the center of the epi layer 12 can be subsequently reduced to a target value.

While the above description involves an N type wafer, the invention applies equally to wafers with a P type epi-layer 12.

Figure 3:
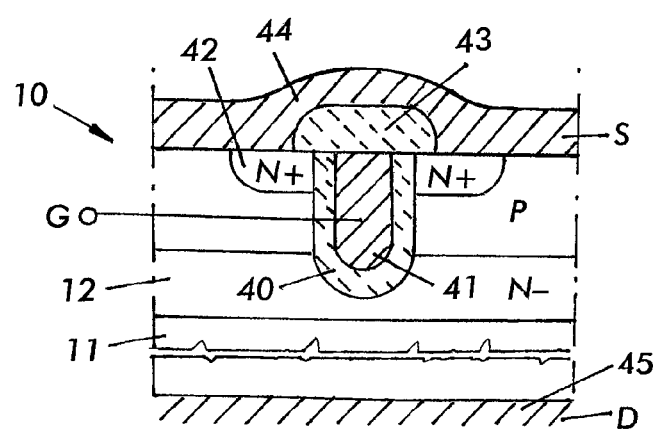
FIG. 3 schematically shows a typical trench in FIG. 2 after further processing to complete a device.

FIG. 3 shows how the die of FIG. 2 can be completed to form a trench type MOSFET. Thus, a silicon dioxide gate layer 40 is grown in each trench and the trenches are filled with a conductive polycrystalline gate mass 41. $N^+$ source regions 42 (which can be formed earlier in the process) are formed as shown, and an insulation cap 43 is formed over the polysilicon gate 41. A source electrode 44 is then formed on the top surface of the device and a drain electrode 45 is formed on the bottom of wafer 10.

The breakdown voltage $BV_{DSS}$ is the voltage at which the device breaks down between the source and drain electrodes.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A wafer that includes a plurality of trench type semiconductor devices formed therein; said wafer comprising a body of monocrystalline semiconductor material; a grown layer of epitaxially grown semiconductor material formed on the top surface of said body; said grown layer of epitaxial silicon having a generally central area surrounded by and continuous with an outer peripheral ring; said generally central area and outer peripheral ring having an impurity concentration of a given species; the impurity concentration of said outer peripheral ring being less than that of said generally central area, whereby the breakdown voltage of a trench type device singulated from said outer peripheral ring is substantially the same as that of a trench type device singulated from said generally central area, and wherein said trench type device singulated from said outer peripheral ring includes trenches that extend deeper into said body of monocrystalline semiconductor material than trenches of said trench type device from said generally central area.

2. The wafer of claim 1, wherein said wafer is silicon.

3. The wafer of claim 1, wherein said species is an N type impurity.

4. The wafer of claim 2, wherein said species is an N type impurity.

5. A silicon wafer that includes a plurality of trench type semiconductor devices formed therein; said wafer having parallel top and bottom surfaces and having a plurality of identical separable die formed over its upper surface; each of said die having a plurality of parallel trenches formed into said upper surface; the trenches in the outer peripheral area of said wafer having a depth greater than the depth of the trenches in central areas of said wafer; a least the upper layer of said wafer having impurity carriers of one of the concentration types therein; the concentration of said impurity carriers being less in said outer peripheral area than in said central areas to balance the breakdown voltages of all die in said wafer.

6. The wafer of claim 5, wherein said wafer is silicon.

7. The wafer of claim 6, wherein said upper layer is an epitaxially deposited layer.

8. The wafer of claim 5, wherein said one of the concentration types is the N type.

9. The wafer of claim 7, wherein said one of the concentration types is the N type.

10. The wafer of claim 5, wherein said devices are trench type MOSFETs.

11. The wafer of claim 7, wherein said devices are trench type MOSFETs.

12. The wafer of claim 8, wherein said devices are trench type MOSFETs.

* * * * *